May 9, 1967 Z. TARCZY-HORNOCH ET AL 3,319,181

HIGH STABILITY PHASE LOCKED OSCILLATOR

Filed June 25, 1964

INVENTORS
Zoltan Tarczy-Hornoch
Patrick Young
BY [signature]
Attorneys

United States Patent Office 3,319,181

Patented May 9, 1967

3,319,181

HIGH STABILITY PHASE LOCKED OSCILLATOR

Zoltan Tarczy-Hornoch, Berkeley, and Patrick Young, Oakland, Calif., assignors to W. K. Rosenberry, Concord, Calif.

Filed June 25, 1964, Ser. No. 377,825

14 Claims. (Cl. 331—49)

This invention relates to a high stability phase locked oscillator and method and more particularly to a high stability phase locked oscillator and method in which or by which the stability is only limited by the stability of the available frequency standard.

Conventional started oscillators have poor frequency stability compared to crystal controlled oscillators. Started oscillators are usually of the LC type rather than of the crystal type because the latter cannot be started up instantly. In order to approximate transient-free start up of an oscillator, it is necessary to simulate the conditions of steady state oscillation by predetermining the voltages and currents throughout the circuit. For the crystal circuit, this is not possible. The equivalent circuit of the crystal consists of an LC shunted by another C. The junction at the series LC is not physically realizable since the crystal is a two-terminal device. Therefore, forced start-up must be accompanied by transients which are detrimental to the long term stability characteristics of the crystal. Also, envelope build-up time is relatively slow since this time is proportional to the high Q of the crystal compared to the Q of LC circuits. In view of the fact that crystal controlled oscillators do not permit instant start-up without sacrificing long term frequency stability, there is a need for a new and improved high stability phase locked oscillator and method.

In general, it is an object of the present invention to provide a high stability phase locked oscillator and method which does not have the above named disadvantages.

Another object of the invention is to provide an oscillator and method of the above character in which the frequency stability is only limited by the accuracy of the frequency standard utilized.

Another object of the invention is to provide an oscillator of the above character which utilizes conventional components.

Additional objects and features of the invention will appear from the following description in which the preferred embodiment is set forth in detail in conjunction with the accompanying drawings.

Referring to the drawings.

Figure 1:
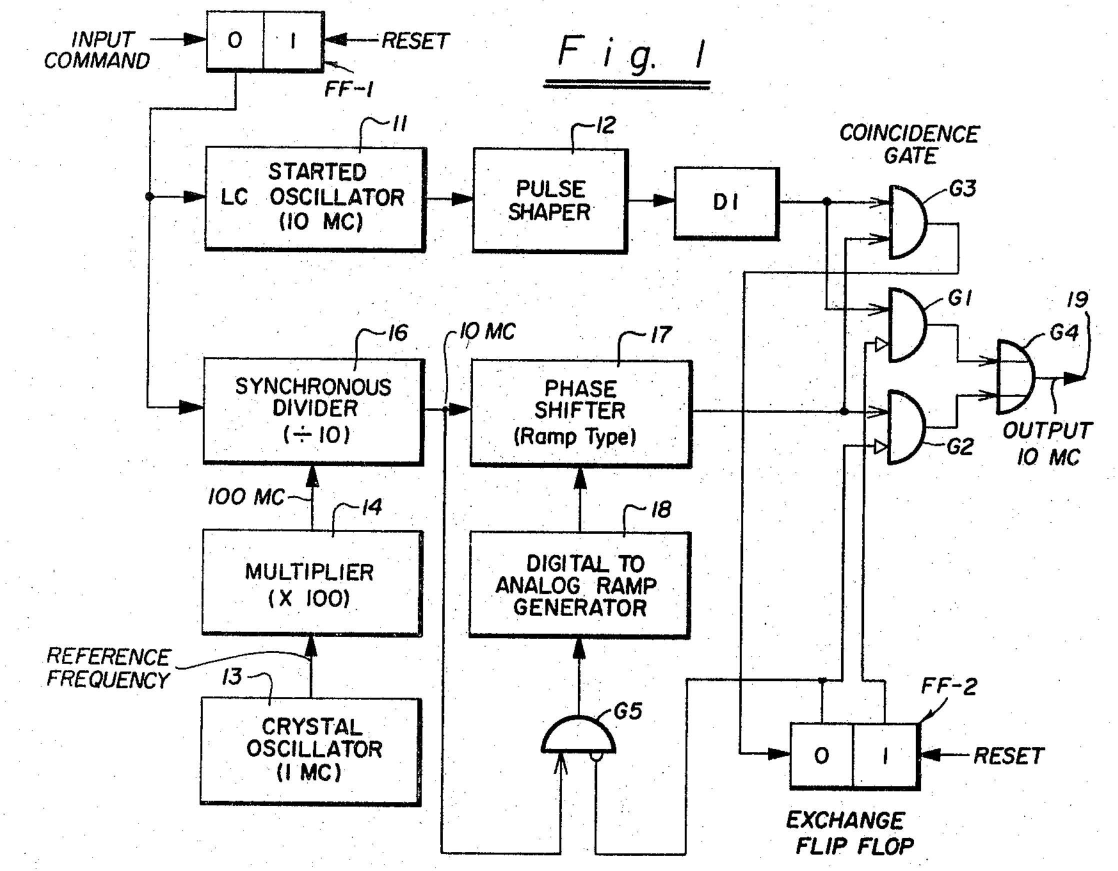
FIGURE 1 is a block diagram of a high stability phase-locked oscillator incorporating the present invention.

In general, the high stability phase-locked oscillator consists of a started oscillator and a stable frequency source. Phase shifting means is connected to the stable frequency source and coincidence sensing means is connected to the output of the phase shifting means and the output of the started oscillator. Means is connected to the coincidence means for shifting from the output of the started oscillator to the output of the phase shifter when coincidence is sensed by the coincidence means to provide an output frequency which has the phase of the started oscillator and the frequency stability of the stable frequency source.

As shown in the drawing, the high stability phase-locked oscillator consists of a pair of flip-flops or binaries which are identified as FF–1 and FF–2. It also includes a started oscillator 11 which can be of any conventional type such as the started oscillators shown in Figures 4.45 and 4.46 and described on pages 140–148 of volume XIX of the MIT series entitled "Waveforms" published by McGraw-Hill Book Company in 1949. As pointed out previously, a started oscillator is conventionally of the LC type and a representative point of its output such as the zero-phase point will start exactly in phase with the start of the signal received from the flip-flop FF–1 when it is trigged by an input or start command.

The high stability phase-locked oscillator includes a pulse shaper 12 which converts the sine wave output of the started oscillator 11 into a series of narrow pulses which are in phase with a representative point, preferably a zero-phase point of the output of the started oscillator. The pulses are fed into a delay line D1. The started oscillator with high frequency stability also includes a crystal oscillator 13, a multiplier 14, a synchronous divider 16, a phase shifter 17, and a digital to analog ramp generator 18. A plurality of gates identified as G1, G2, G3, G4 and G5 also form a part of the started oscillator. All of these various components which are utilized in the started oscillator with high frequency stability are conventional, and for that reason will not be described in detail.

Operation of the started oscillator with high frequency stability in performing the present method may now be briefly described as follows. Let it be assumed that it is desired to produce an output frequency of 10 mc. (megacycles) which will start exactly in the phase with an input command and which will have the high frequency stability of the reference oscillator. For this purpose, a reference frequency of 1 mc. is provided from the crystal oscillator 13. This is multiplied in the multiplier 14 to a suitable value, such as by 100, to give a 100 mc. reference frequency which is supplied to the synchronous divider 16.

Let it be assumed that the exchange flip-flop FF–2 is in a reset condition as shown in FIGURE 1. When this is true, AND gate G1 is enabled so that the started oscillator 11 is connected to the output terminal 19 through the pulse shaper 12, delay D1 and the OR gate G4. Upon receipt of the input command, the FF–1 is triggered to supply a start signal to the started oscillator 11 to cause it to commence operation. At this same time, the start signal is also supplied to the synchronous divider 16. The synchronous divider 16, upon being activated, accepts the first complete cycle of the 100 mc. input from the multiplier 14 and starts its dividing action. Since the synchronous divider divides by a suitable number such as by 10, the output is a 10 mc. signal whose zero phase or zero crossing is within one cycle of 100 mc. or within 10 nanoseconds of the command input. This is a factor of 10 improvement of what would be the case if the multiplier 14 only multiplied the frequency of the crystal oscillator up to 10 mc. rather than 100 mc. This is true because the phase of the oscillator and the phase of the started oscillator 11 could be shifted with respect to each other by as much as one full cycle which could be as much as 100 ns. (nanoseconds). By first multiplying up to a higher frequency by the multiplier 14 and then dividing down with the synchronous divider 16, the synchronized divider output 16 can be off in phase from the started oscillator phase by at most 10 ns. or one-tenth of the value of 100 ns. if the frequency had not been divided down. In other words, the synchronous divider 16 is semi-phase locked to the started oscillator because the phase difference is within a much smaller tolerance. Thus, the synchronized divider 16, in addition to being phase locked to the multiplier output, is also semi-phase locked to the started oscillator. The same results can be obtained by starting with a higher reference frequency and dividing it down.

The digital-to-analog ramp generator 18 is activated by the output from the synchronous divider 16 to generate a staircase ramp signal 21. The generator 18 is essentially a counter with a digital to analog converted output which is gated by the inhibit gate G5 and driven by the synchronous divider 16 which serves as a clock generator. Other clock generators with the same or different clock frequency can be used. From FIGURE 2, it can be seen that as time increases, the analog signal 21 is continuously increasing in small steps to provide the very fine stepped linear ramp voltage.

Figure 2:
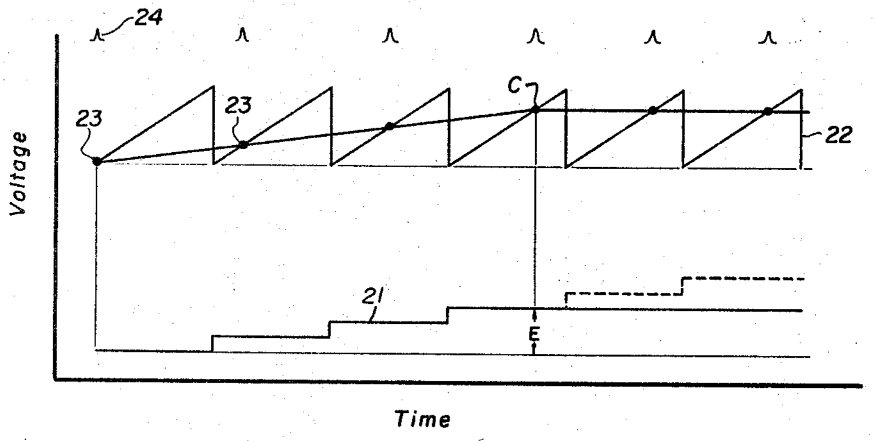
FIGURE 2 is a graph showing signals generated within the oscillator shown in FIGURE 1.

As explained above, the output of the synchronous divider 16 and the output of the digital-to-analog ramp generator 18 are supplied to the phase shifter 17. In the phase shifter 17, the input signal from the synchronous divider 16 is converted into a triangularly shaped pulse train 22 commonly called a sawtooth waveform as shown in FIGURE 2. The period of each step of the staircase 21 preferably should be identical to the period of each sawtooth of the sawtooth waveform 22, the staircase being advanced a step at the termination of each sawtooth. This arrangement is not absolutely necessary. A shorter period for either the sawtooth wave form or the staircase can be used without a shorter period for the other, although there is no advantage in doing so.

The phase shifter 17 also serves as a voltage comparator and picks the points 23 on the triangularly shaped wave train which correspond to the input voltage which is generated as a ramp. The signal that is desired is the 10 mc. signal from the synchronous divider 16 which is to be shifted in phase. Thus, there is generated the triangularly shaped or the sawtooth wave 22 having a period of 100 ns. corresponding to the 10 mc. input. This is compared with the long ramp voltage 21 supplied by the digital-to-analog ramp generator 18. Every time the rising edge of the sawtooth 22 reaches the level of the long ramp voltage 21 at each of the points 23, the phase shifter 17 produces an output pulse 24 corresponding to each point 23, as shown in FIGURE 2. Initially, the output pulse 24 is produced when the ramp voltage 22 is of a minimum value. Upon the next cycle, the phase shifter 17 is supplied with a little higher voltage from the digital-to-analog ramp generator 18, and for this reason, the phase shifter 17 will produce an output pulse 23 which is a little later in time or in phase when compared with the start of the sawtooth waveform 22. Thus, the phase shifter 17 produces a series of pulses which are successively delayed in phase. By way of example, if 100 steps are used in the ramp voltage 21 to provide a 10 ns. phase shift, each digital step of the ramp voltage provides a phase shift of .1 ns. in the output of the phase shifter 17.

The output pulses 24 from the phase shifter 17 are supplied to the AND or coincidence gate G3 until the output pulses from the phase shifter have been sufficiently advanced in phase to coincide with the pulses from the start oscillator 11 after the latter have been shaped by the pulse shaper 12 and delayed by the delay D1. The delay D1 has been inserted in the output from the started oscillator 11 so that the output of the synchronous divider 16 will have a phase which is always advanced with respect to the start oscillator. As can be appreciated by those skilled in the art, this simplifies the circuitry required in that it makes it necessary to only add a positive delay through the phase shifter 17. As soon as the two inputs to the gate G3 are in coincidence, an output signal is supplied to the exchange flip-flop FF–2 and triggers the flip-flop FF–2 to its set condition. Upon being triggered, the flip-flop FF–2 provides a signal to the inhibit gate G5 to remove the driving signal from the ramp generator 18. This stops the staircase output from the ramp generator 18 at the time of coincidence which, by way of example, is indicated as point C in FIGURE 2. The ramp generator thereafter provides a constant voltage output of voltage E as shown in FIGURE 2.

The constant voltage supplied to the phase shifter 17 by the ramp generator 18 as soon as the input signal to the ramp generator 18 has been gated off causes the phase shifter 17 to supply output pulses 24 which are shifted in phase by the exact amount of phase shift which was being introduced by the phase shifter at the time of coincidence. For this reason, the output from the phase shifter 17 and the output from the start oscillator 11 are exactly in phase and, therefore, interchangeable.

Triggering of the flip-flop FF–2 by the coincidence gate G3, in addition to inhibiting gate G5, disables gate G1 and, therefore, prevents the output from the start oscillator 11 from passing through the OR gate G4 to the output terminal 19. However, simultaneously with the disabling of gate G1, gate G2, is enabled by the flip-flop FF–2 so that the output wavetrain from the phase shifter 17 is supplied to the OR gate G4 and to the output. Thus, it can be seen that upon achieving coincidence, an exchange between the output of the phase shifter 17 and the output of the start oscillator 11 occurs. Looking in from the output terminal 19, it would be impossible to tell whether the pulses were coming from the start oscillator 11 or from the phase shifter 17 because they are exactly in phase. There is, therefore, no discontinuity or transient in the output from the gate G4. The exchange flip-flop FF–2 changes state and the operative gates are gated on and off between two pulses since coincidence was achieved when a pulse was present. The next pulse from either the started oscillator or the phase shifter cannot come before 100 nanoseconds and for that reason, there is adequate time in which to switch the gates. Therefore, the last pulse from the start oscillator and the first pulse from the phase shifter will have precisely the same spacing as would two pulses from the started oscillator or two pulses from the phase shifter.

After coincidence, the output on terminal 19 is the output from the phase shifter 17. The output from the phase shifter 17 will not shift in phase because the ramp generator 18 has been stopped and provides a constant output voltage. Thus, it can be seen that the output of the phase shifter 17 is substituted for the output of the started oscillator 11 to provide an output frequency which is in a fixed phase relation with the input command and which has a frequency stability which is controlled by the crystal reference oscillator 13.

The conversion accuracy is generally limited and is equal to the resolution of the digital-to-analog ramp generator. By way of example, with the frequencies given above, the accuracy is 0.1 ns. The maximum conversion time occurs when the output of the synchronous divider 16 is delayed one full cycle (of 100 mc. or 10 ns.) from the input command. The maximum conversion time is given by:

$$f_{in}/f_{out} \times T_p^2/T_a$$

where $f_{in}/f_{out}$=ratio of input to output frequency of synchronous divider;
$T_p$=period of output frequency;
$T_a$=accuracy of conversion.

In the example given above, the conversion time is $10^4$ ns. or 10 ms. The short term stability of the started oscillator must be accurate to 0.1 ns./10 mc. or 1 part in $10^5$ if the conversion accuracy is not to be deteriorated by the started oscillator.

It is apparent from the foregoing that a new and improved high stability phase locked oscillator has been provided. The output from the circuitry is in a fixed phase with the input command and has a frequency stability which is only limited by the accuracy of the frequency standard utilized.

We claim:

1. In a high stability phase-locked oscillator, a started oscillator, a source of stable frequency, phase shifting means connected to the source of stable frequency, means for causing the started oscillator to commence operation upon receipt of an input command so that the output from the started oscillator starts in a fixed phase relationship with the input command, means for causing the phase shifting means to shift the phase of the frequency supplied to it, coincidence means connected to the output of the started oscillator and the phase shifting means for sensing when the output of the phase shifting means is in phase with the output of the started oscillator, control means activated by the coincidence means for generating a control signal, means connecting the control signal to the phase shifting means for preventing said phase shifting means from continuing to shift the phase of the stable frequency after coincidence is achieved, and exchanging means for exchanging the output of the phase shifting means for the output of the started oscillator to provide an output frequency having the phase of the started oscillator and the frequency stability of the source of stable frequency.

2. An oscillator as in claim 1 together with a multiplier and a synchronous divider are connected between the stable frequency source and the phase shifting means and wherein said means for causing the started oscillator to commence operation also causes the synchronous divider to become active upon receipt of the input command.

3. An oscillator as in claim 1 together with delay means connected between the started oscillator and the coincidence means to delay the output of the started oscillator.

4. In a high stability phase locked oscillator, a started oscillator, means for supplying an input command to the started oscillator to cause it to start in fixed phase relationship with the input command, a source of reference frequency, phase shifting means, means for supplying the output of the source of reference frequency to the phase shifting means coincidence means connected to the output of the phase shifting means and to the output of the started oscillator, means operated by the coincidence means when it achieves coincidence for preventing said phase shifting means from shifting phase after coincidence is achieved and means for exchanging the output from the started oscillator for the output from the phase shifter to thereby provide an output which has the phase of the started oscillator and the frequency stability of the stable frequency source.

5. In a high stability phase locked oscillator with high frequency stability, an output terminal, a started oscillator, means for supplying an input command to the started oscillator so that it starts in a fixed phase relationship with the input command, a source of reference frequency, a synchronous divider connected to the output of the source of reference frequency, a phase shifter connected to the output of the synchronous divider for shifting the phase of the output of the synchronous divider, means including coincidence means connected to the output of the started oscillator and the phase shifter, means operated by said coincidence means when coincidence is sensed to prevent said phase shifter from shifting the phase of the reference frequency after coincidence is achieved and means connected to the output terminal for exchanging the outputs from the started oscillator and the phase shifter so that the output at the output terminal has the phase of the output from the started oscillator and the frequency stability of source of reference frequency.

6. A started oscillator as in claim 5 together with means for supplying the input command to the synchronous divider to cause it to commence dividing upon receipt of the input command.

7. In a high stability phase locked oscillator with high frequency stability, a started oscillator, a pulse shaper connected to the output ofthe started oscillator, means for supplying an input command signal to the started oscillator to cause it to start in a fixed phase relationship with the input command signal, a source of reference frequency, a multiplier connected to the source of reference frequency, a synchronous divider connected to the multiplier, a phase shifter connected to the output of the synchronous divider, a digital-to-analog ramp generator connected to the phase shifter, means for supplying an input command signal to the synchronous divider in a fixed time relationship with the start of the started oscillator, means connected to the synchronous divider for starting the digital-to-analog ramp generator, coincidence means connected to the output of the phase shifter and to the output of the pulse shaper, an output terminal, means connecting the output of the pulse shaper and the output of the phase shifter to the output terminal, the connecting means including means causing the output of the started oscillator to be initially supplied to the output terminal, and means connected to and operated by said coincidence means when coincidence is achieved for stopping the digital-to-analog ramp generator to thereby cause the ramp generator to thereafter provide a constant signal to the phase shifter and to cause the signal from the phase shifter to be supplied to the output terminal in place of the output of the started oscillator.

8. An oscillator as in claim 7 wherein said means operated by the coincidence means includes a bistable device, gate means connecting the bistable device to the digital-to-analog ramp generator, and gate means connected to said bistable device, said first named gate means forming a part of the means connected to the synchronous divider for starting the digital-to-analog ramp generator, said last named gate means forming a part of the means connecting the output of the pulse shaper and the output of the phase shifter to the output terminal.

9. An oscillator as in claim 7 wherein the phase shifter is of the ramp type and causes the output of the synchronous divider to be formed into a trangularly shaped waveform and produces a pulse each time the rising edge of the waveform reaches the level of the ramp signal from the ramp generator.

10. In apparatus for generating a frequency at an output terminal having a phase which is in phase with the phase of an input command and which has a high frequency stability, means for generating a first signal which is in a fixed phase relationship with the input command, means for generating a second signal having a predetermined reference frequency, means for shifting the phase of the reference frequency to provide a third signal, means for determining when the phase of the first and third signals are in coincidence, means for halting the shifting of the reference signal after coincidence is achieved and means connected to the output of the first signal generating means and to the output of the phase shifting means and responsive to an output of the means for halting the shifting of the reference signal for exchanging the output from the first signal to the third signal after coincidence is achieved..

11. Apparatus as in claim 10 wherein the means for generating a second signal includes means for generating a constant frequency and means for, dividing the constant frequency by a predetermined number.

12. Apparatus as in claim 11 wherein said means for generating a second signal includes means for multiplying the constant frequency by a predetermined number.

13. Apparatus as in claim 11 together with means for causing the dividing means to commence operation upon receipt of the input command.

14. Apparatus as in claim 10 wherein the means for shifting the phase of the reference frequency includes means for generating a ramp signal, means for generating a triangularly shaped waveform from the reference frequency and means for generating pulses at the points of equal level of the ramp signal and the waveform.

No references cited.

ROY LAKE, *Primary Examiner.*

J. B. MULLINS, *Assistant Examiner.*